(12) United States Patent
Baba-Ali et al.

(10) Patent No.: US 7,400,382 B2
(45) Date of Patent: Jul. 15, 2008

(54) LIGHT PATTERNING DEVICE USING TILTING MIRRORS IN A SUPERPIXEL FORM

(75) Inventors: Nabila Baba-Ali, Ridgefield, CT (US); Arno Jan Bleeker, Westerhoven (NL); Kars Zeger Troost, Waalre (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 223 days.

(21) Appl. No.: 11/116,338

(22) Filed: Apr. 28, 2005

(65) Prior Publication Data

US 2006/0245033 A1 Nov. 2, 2006

(51) Int. Cl.
G03B 27/54 (2006.01)

(52) U.S. Cl. ..................................... 355/67
(58) Field of Classification Search .................. 355/67, 355/71
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |

(Continued)

FOREIGN PATENT DOCUMENTS

EP 0 568 801 A1 11/1993

(Continued)

OTHER PUBLICATIONS

Search Report, dated Oct. 17, 2006, for EP Patent Application No. 06252250.3-1226, 10 pages.

(Continued)

Primary Examiner—Della J. Rutledge
(74) Attorney, Agent, or Firm—Sterne, Kessler, Goldstein & Fox, P.L.L.C.

(57) ABSTRACT

A light patterning system comprises an illumination system that supplies a beam of radiation having a certain wavelength ($\lambda$). An array of reflective pixels patterns the beam, wherein the array includes pixels having at least a first tilting mirror that is logically coupled to a second tilting mirror. In an embodiment, the first and second tilting mirrors are (i) substantially adjacent to each other; and (ii) offset in height from each other by a first mirror displacement. A projection system is included that projects the patterned beam onto a target. In alternate embodiment, the array of reflective pixels includes pixels having first through fourth tilting mirrors that are logically coupled to each other. The first through fourth tilting mirrors are (i) respectively offset in height from a reference plane by first through fourth mirror displacements, and (ii) are respectively arranged clockwise in a substantially square pattern.

29 Claims, 7 Drawing Sheets

U.S. PATENT DOCUMENTS

| | | |
|---|---|---|
| 6,806,897 B2 | 10/2004 | Kataoka et al. |
| 6,811,953 B2 | 11/2004 | Hatada et al. |
| 6,833,854 B1 | 12/2004 | Sandström |
| 7,064,880 B2 * | 6/2006 | Mushika ............ 359/237 |
| 7,068,415 B2 * | 6/2006 | Mushika ............ 359/291 |
| 2001/0045690 A1 | 11/2001 | Brandinger |
| 2003/0210383 A1 * | 11/2003 | Bjorklund et al. ........ 355/53 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0068510 A1 | 3/2005 | Bleeker et al. |
| 2005/0153246 A1 | 7/2005 | Eib et al. |

FOREIGN PATENT DOCUMENTS

| | | |
|---|---|---|
| WO | WO 98/33096 | 7/1998 |
| WO | WO 98/38597 | 9/1998 |

OTHER PUBLICATIONS

Ljungblad et al., "Phase shifted addressing using a spatial light modulator", Microelectronic Engineering, vol. 78-79, Jan. 19, 2005, pp. 398-403.

Chung et al., "Design and fabrication of 10×10 micro-spatial light modulator array for phase and amplitude modulation", Sensors and Actuators, vol. 78, No. 1, Jan. 1999, pp. 63-70.

* cited by examiner

LIGHT PATTERNING DEVICE USING TILTING MIRRORS IN A SUPERPIXEL FORM

BACKGROUND OF THE INVENTION

1. Field of the Invention

The present invention relates to a light patterning device and method of using same.

2. Background

A patterning device is used to pattern incoming light. A static patterning device can include reticles or masks. A dynamic patterning device can include an array of individually controllable elements that generate a pattern through receipt of analog or digital signals. Such dynamic patterning devices are sometimes referred to as maskless systems. Example environments for use of the patterning device can be, but are not limited to, a lithographic apparatus, a projector, a projection display apparatus, or the like.

Currently, arrays of individually controllable elements, sometimes referred to as spatial light modulators (SLMs), can include various types of micromirror arrays. Mirror types include, but are not limited to, flat tilting mirrors, single phase-step tilting mirrors, piston mirrors, or hybrid mirrors combining tilt and piston actions. When imaging with micromirror arrays as the object, the phase and intensity of the light reflected by each mirror are important parameters. In conventional arrays of individually controllable elements having tilting mirrors, a maximum amount of negative light (i.e., out-of-phase light) reaching the image plane is much smaller than a maximum amount of positive light (i.e., in-phase light) reaching the image plane. For instance, flat tilting mirrors can achieve an intensity modulation or grayscale anywhere between 100% positive phase intensity and 4.7% negative phase intensity. This limited negative phase intensity has proven to be a limitation in emulating certain types of conventional masks, such as phase shifting masks.

One method of improving intensity modulation or grayscale characteristics is to use single phase-step tilting mirror having, for example, a $\lambda/4$ height step and phase step of $\lambda/2$, where $\lambda$ is an imaging wavelength. Such a mirror has been invented by Micronic Laser Systems of Sweden. This mirror can achieve a phase intensity modulation anywhere between +50% and −50%. Another method for improving intensity modulation characteristics is to use a dual phase-step tilting mirror, as is disclosed in a co-pending application Ser. No. 10/995,092, (Attorney Docket No. 1857.3290000), entitled "Pattern generator using a dual phase step element and method of using same," filed Nov. 24, 2004, which is incorporated by reference herein.

Generally speaking, however, the lithographic performance of tilting mirrors is strongly sensitive to mirror-to-mirror phase/height errors. Work undertaken by the inventors indicates height requirements at the 65 nm node are of the order of 1 nm, with statistical deviation of 1 sigma (i.e., one standard deviation). Current SLM technology does not allow such a level of mirror height control. State of the art SLM's exhibit errors that are at least four times larger than what is needed.

For these and other reasons, further alternative solutions are needed to improve intensity and phase modulation characteristics for an array of individually controllable elements, such as tilting mirrors. For example it would be beneficial to mimic arbitrary grayscale and phase independently to effectively emulate different types of lithographic masks, such as binary masks, attenuating phase-shifting masks (AttPSM), alternating phase-shifting masks (AltPSM), CPL and vortex masks.

BRIEF SUMMARY OF THE INVENTION

A light patterning system comprises an illumination system that supplies a beam of radiation having a certain wavelength ($\lambda$). An array of reflective pixels patterns the beam, wherein the array includes pixels having at least a first tilting mirror that is logically coupled to a second tilting mirror. In an embodiment, the first and second tilting mirrors are (i) substantially adjacent to each other; and (ii) offset in height from each other by a first mirror displacement. Finally, a projection system is included that projects the patterned beam onto a target. In an alternate embodiment, the array of reflective pixels includes pixels having first through fourth tilting mirrors that are logically coupled to each other. The first through fourth tilting mirrors are (i) respectively offset in height from a reference plane by first through fourth mirror displacements, and (ii) are respectively arranged clockwise in a substantially square pattern. Other multiples of mirrors can be used as well.

A method for patterning a beam of radiation is also described. The method comprises patterning a beam of radiation having a wavelength ($\lambda$) with an array of reflective pixels. The array includes superpixels having at least a first tilting mirror that is logically coupled to a second tilting mirror. The first and second tilting mirrors are (i) offset in height from each other by a first mirror displacement, and (ii) substantially adjacent to each other. The patterned beam is then projected onto a target portion of an object. Similar methods for four or more mirrors are disclosed.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. In the drawings, like reference numbers indicate identical or functionally similar elements. Additionally, in most drawings, the leftmost digit of a reference number identifies the drawing in which the reference number first appears.

The present invention will now be described with reference to the accompanying drawings.

DETAILED DESCRIPTION OF THE INVENTION

Overview

Although specific reference may be made in this text to the use of a patterning device in a lithographic system that patterns a substrate, it should be understood that the patterning device described herein may have other applications, such as in a projector or a projection system to pattern an object or display device (e.g., in a projection television system, or the like). Therefore, the use of the lithographic system and/or substrate throughout this description is only to describe example embodiments of the present invention.

A system and method are used to pattern light using an illumination system, an array of individually controllable elements, and a projection system. The illumination system supplies a beam of radiation. The array of individually controllable elements (SLMs) patterns the beam. The projection system projects the patterned beam onto a target portion of an object. In various examples, the object can be a display device, a semiconductor substrate or wafer, a flat panel display glass substrate, or the like, as is discussed in more detail below.

Arrays of individually controllable elements can include various types of SLMs. Mirror types include, but are not limited to, flat tilting mirrors, single phase-step tilting mirrors, piston mirrors, or hybrid mirrors combining tilt and piston actions. However, as noted above, intensity modulation constraints (e.g., unequal maximum amplitude of positive and negative light) prevent these arrays from effectively emulating various types of masks (e.g., phase shifting masks). Moreover, these arrays are often inefficient when correcting various types of SLM imperfections or errors.

In an embodiment, the array of individually controllable elements comprises tilting mirror SLMs. The tilting mirrors may be flat tilting mirrors, or phase-stepped tilting mirrors. The individually controllable tilting mirrors may be offset in height from each other, and are programmably selected into logically coupled groups of two or more to form a superpixel. The inventors have discovered that combining tilting mirrors that are offset in height into superpixels improves intensity modulation characteristics, and enhances the array's ability to mimic arbitrary grayscale and phase. Such characteristics also allow the correction of various types of SLM imperfections or errors. In an embodiment, a superpixel is formed when groups of tilting mirrors (e.g., 2×2, or 4×4, etc.) are logically coupled to perform as one large pixel. By programmably selecting the tilt angles of the tilting mirrors that form the superpixel, a variety of phase and grayscale combinations are possible. Additionally, the tilting mirrors that form a superpixel may be programmably selected depending on the location of desired features.

Terminology

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, micro and macro fluidic devices, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The term "array of individually controllable elements" as employed herein should be broadly interpreted as referring to any array that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed above and below.

In an embodiment, the array of individually controllable elements can include a programmable mirror array employing a matrix arrangement of micro-mirrors, each of which can be individually tilted about an axis by applying a suitable localized electric field, or by employing piezoelectric actuation means, for example. The size of a typical micro-mirror is on the order of 8 μm×8 μm. The micro-mirrors are matrix-addressable, such that addressed mirrors will reflect an incoming radiation beam differently than unaddressed mirrors. In this manner, the reflected beam is patterned according to the addressing pattern of the matrix-addressable mirrors. The required matrix addressing can be performed using suitable electronic means.

In one example, groups of the mirrors can be coordinated together in a superpixel that performs as a single pixel. In this example, an optical element in a illumination system can form beams of light, such that each beam falls on a respective group of mirrors. In an embodiment, the array of individually controllable elements can comprise one or more programmable mirror arrays.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time, or a given number of exposures, during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

In the lithography environment, the term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the substrate and the first element of the projection system. Immersion techniques are used to increase the numerical aperture of projection systems. Further, the apparatus may be provided with a fluid processing cell to allow interactions between a fluid and irradiated parts of the substrate.

Exemplary Environment for a Patterning Device

Although the patterning device of the present invention can be used in many different environments, as discussed above, a lithographic environment will be used in the description below. This is for illustrative purposes only.

A lithographic apparatus is a machine that applies a desired pattern onto a target portion of an object. The lithographic apparatus can be used, for example, to pattern an object in a biotechnology environment, in the manufacture of ICs, flat panel displays, micro or nano fluidic devices, and other devices involving fine structures. In a an IC-based lithographic environment, the patterning device is used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). As discussed above, instead of a mask, in maskless IC lithography the patterning device may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction. These concepts will be discussed in more detail below.

Figure 1:
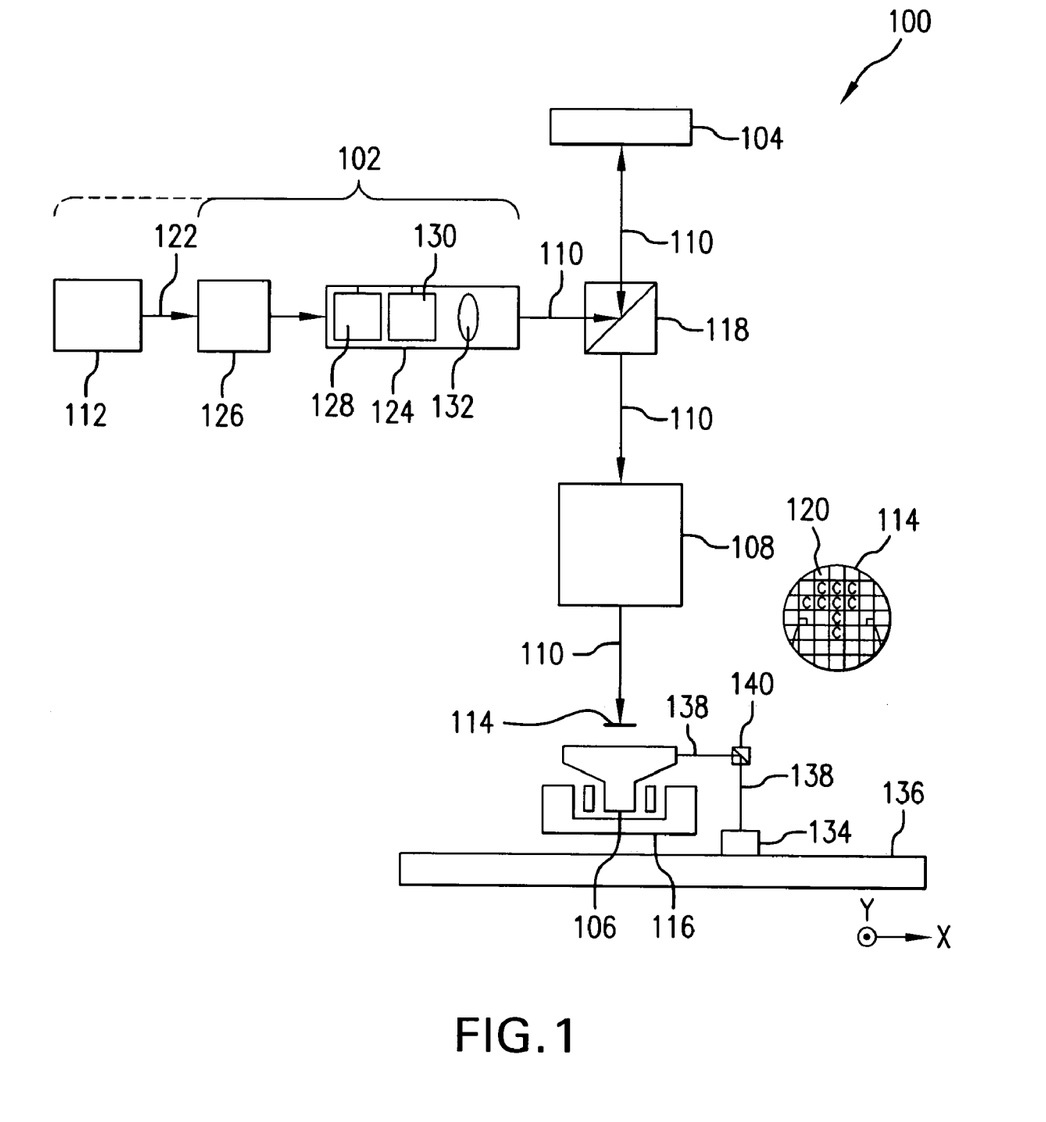
FIG. 1 depicts a lithographic apparatus, according to one embodiment of the invention.

FIG. 1 schematically depicts a lithographic projection apparatus 100, according to one embodiment of the invention. Apparatus 100 includes at least a radiation system 102, a patterning device 104 (e.g., a static device or an array of individually controllable elements), an object table 106 (e.g., a substrate table), and a projection system ("lens") 108.

Radiation system 102 is used to supply a beam 110 of radiation, which in this example also comprises a radiation source 112. As noted above, the radiation beam can include a variety of sources including UV and EUV.

Array of individually controllable elements 104 (e.g., a programmable mirror array) is used to pattern beam 110. In one example, the position of the array of individually controllable elements 104 is fixed relative to projection system 108. However, in another example, array of individually controllable elements 104 is connected to a positioning device (not shown) that positions it with respect to projection system 108. In the example shown, each element in the array of individually controllable elements 104 are of a reflective type (e.g., have a reflective array of individually controllable elements).

Object table 106 is provided with an object holder (not specifically shown) for holding an object 114 (e.g., a resist coated silicon wafer, a glass substrate, or the like). In one example, substrate table 106 is connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) is used to project the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser, or the like) produces a beam of radiation 122. Beam 122 is fed into an illumination system (illuminator) 124, either directly or after having traversed conditioning device 126, such as a beam expander 126, for example. Illuminator 124 can comprise an adjusting device 128 that sets the outer and/or inner radial extent (commonly referred to as σ-outer and σ-inner, respectively) of the intensity distribution in beam 122. In addition, illuminator 124 can include various other components, such as an integrator 130 and a condenser 132. In this way, beam 110 impinging on the array of individually controllable elements 104 has a desired uniformity and intensity distribution in its cross-section.

In one example, source 112 is within the housing of lithographic projection apparatus 100 (as is often the case when source 112 is a mercury lamp, for example). In another example, source 112 is remotely located with respect to lithographic projection apparatus 100. In this latter example, radiation beam 122 is directed into apparatus 100 (e.g., with the aid of suitable directing mirrors (not shown)). This latter scenario is often the case when source 112 is an excimer laser. It is to be appreciated that both of these scenarios are contemplated within the scope of the present invention.

Beam 110 subsequently interacts with the array of individually controllable elements 104 after being directed using beam splitter 118. In the example shown, having been reflected by the array of individually controllable elements 104, beam 110 passes through projection system 108, which focuses beam 110 onto a target portion 120 of substrate 114.

With the aid of positioning device 116, and optionally interferometric measuring device 134 on a base plate 136 that receives interferometric beams 138 via beam splitter 140, substrate table 106 is moved accurately, so as to position different target portions 120 in a path of beam 110.

In one example, a positioning device (not shown) for the array of individually controllable elements 104 can be used to accurately correct the position of the array of individually controllable elements 104 with respect to the path of beam 110, e.g., during a scan.

In one example, movement of substrate table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 may alternatively/additionally be moveable, while substrate table 106 and/or the array of individually controllable elements 104 may have a fixed position to provide the required relative movement.

In another example, substrate table 106 may be fixed, with substrate 114 being moveable over substrate table 106. Where this is done, substrate table 106 is provided with a multitude of openings on a flat uppermost surface. A gas is fed through the openings to provide a gas cushion, which supports substrate 114. This is referred to as an air bearing arrangement. Substrate 114 is moved over substrate table 106 using one or more actuators (not shown), which accurately position substrate 114 with respect to the path of beam 110. In another example, substrate 114 is moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography, and for other applications.

The depicted apparatus 100 can be used in at least one of five modes:

1. Step mode: the entire pattern on the array of individually controllable elements 104 is projected during a single exposure (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 moves in a given direction (e.g., a "scan direction," for example, the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary, and the entire pattern is projected onto a target portion 120 of substrate 114 using pulsed radiation system 102. Substrate table 106 is moved with an essentially constant speed, such that patterned beam 110 scans a line across substrate 106. The pattern on the array of individually controllable elements 104 is updated as required between pulses of radiation system 102, and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use may also be employed.

Exemplary Superpixels in the Array of Programmable Elements

As noted above, an embodiment of the present invention includes an illumination system that supplies a beam of radiation, an array of individually controllable elements for patterning the beam of radiation (e.g., an SLM chip), and a projection system that projects the patterned beam onto a target. The array of individually controllable elements preferably includes a plurality of individual tilting mirrors that are formed into one or more "superpixels." A superpixel is formed when at least two substantially adjacent tilting mirrors are logically coupled to each other, and act together as a single pixel. Two parameters of the superpixel are of particular interest to the present invention. First, the respective tilt angles of the individual tilting mirrors in the superpixel can be programmably selected to reflect the beam of radiation with a certain intensity, or grayscale. Second, two adjacent tilting mirrors may be offset in height from each other by a certain mirror displacement to achieve a desired phase offset. By adjusting these two parameters, a superpixel according to the present invention can mimic grayscale and phase of all known types of masks, including Binary, AttPSM, AltPSM, CPL and vortex masks. Furthermore, a superpixel according to the present invention also allows for the correction of phase error and other SLM errors that are known to be uncorrectable by any tilting mirror calibration process.

Figures 2A, 2B:
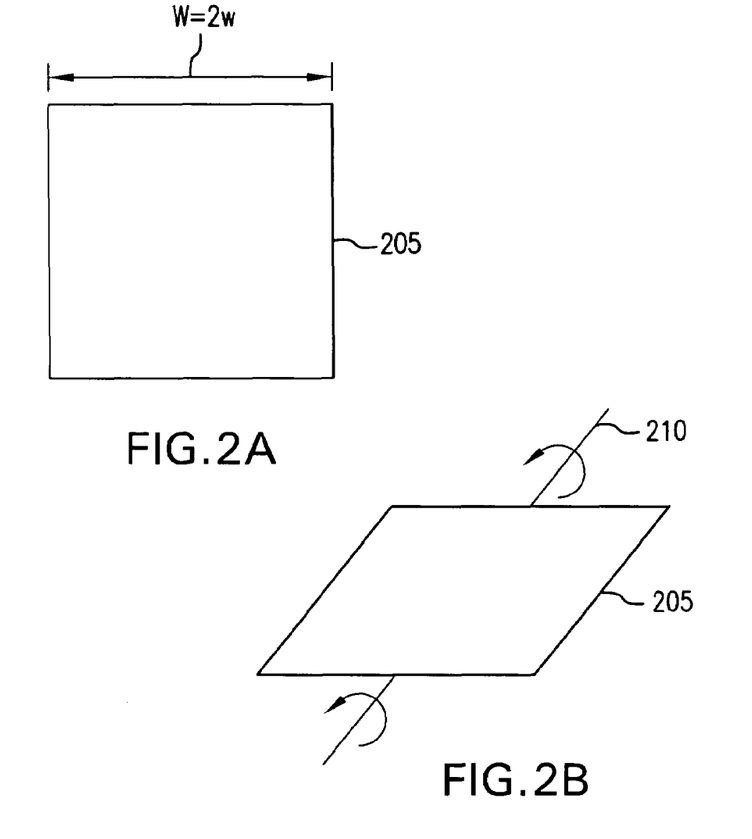
FIGS. 2A and 2B illustrate a flat tilting mirror.

FIGS. 2A and 2B illustrate a basic square flat tilting mirror. Tilting mirror 205 has a width (W) and can be tilted along its axis 210. Tilting mirror 205 is preferably a "phase-type" tilting mirror. A phase-type tilting mirror typically operates in an analog mode wherein numerous states exist between the mirror being fully on (i.e., maximum reflectivity intensity) and fully off (i.e., zero reflectivity intensity). The different states correspond to differing grayscales or intensities, and are controlled by the tilt angle. A phase-type tilting mirror can be contrasted with a "deflection-type" tilting mirror, which deflects the incident beam of radiation geometrically to one side so that it misses the aperture of an imaging lens. A deflection-type tilting mirror thus operates in a digital mode where it is either fully on, or fully off.

Figure 2C:
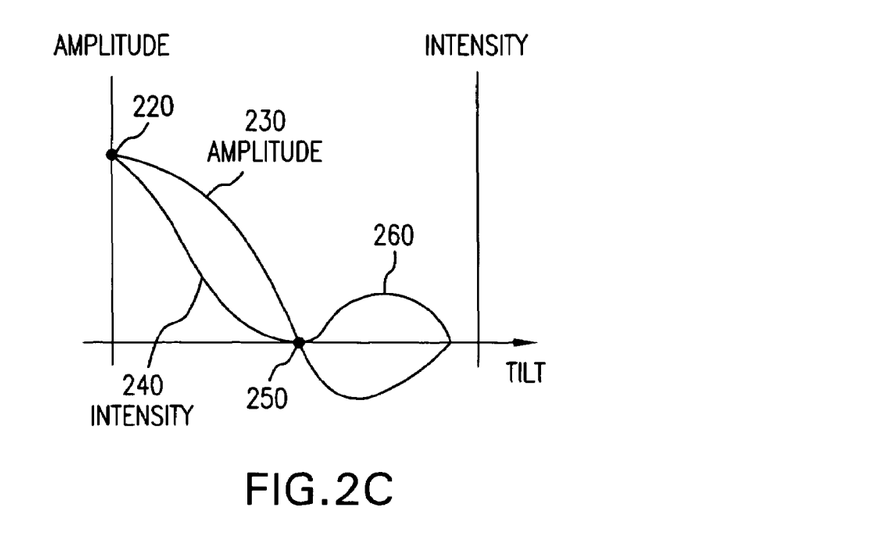
FIG. 2C illustrates the amplitude reflectivity and intensity characteristics of a flat tilting mirror.

As noted above, one important parameter of-the tilting mirrors that make up the superpixel is the tilt angle. The state of a phase-type mirror is controlled by its tilt angle. This relationship is illustrated in FIG. 2C. The amplitude function is illustrated by line 230, while the intensity function is illustrated by line 240. A state of maximum amplitude and intensity is shown at point 220, where tilt angle is zero. A zero tilt angle typically occurs when the mirror is at rest or untilted (e.g., not addressed in the SLM array). As the mirror is tilted, amplitude and intensity decrease to a state of minimum intensity and zero amplitude, illustrated by tilt angle 250. Tilt angle 250 is the zero crossing tilt angle. For a square mirror, the point of minimum intensity occurs where the tilt is one half the wavelength ($\lambda$) of the incident beam of radiation from one side of the mirror to the other. As the tilt angle increases past the zero crossing tilt angle, the complex amplitude can have a negative sign, while the magnitude of the intensity stays positive. Such tilt angles can be referred to as black tilt angles. The black tilt angle having a maximum negative amplitude is shown at tilt angle 260. The average amplitude response for a square flat tilting mirror is given by:

$$\tilde{A} = w^2 \mathrm{sinc}\left(\frac{\alpha}{\alpha_o}\right)$$

$$\alpha_o = \frac{1}{2}\frac{\lambda}{Mw} \text{(zero crossing tilt angle)}$$

$$\alpha_{nb} \approx 1.4\alpha_o \text{(maximum negative black tilt angle)}$$

where $\alpha$ is the tilt angle, w is ½ W of the tilting mirror, $\lambda$ is the wavelength of the incident beam of radiation, and M is (need to get from inventor). Each tilting mirror making up a superpixel has an individually controllable (i.e., programmable) tilt angle.

As noted above, a second important parameter of the superpixels is the height offset between the individual tilting mirrors that make up the superpixel. Individually, adjacent flat micromirrors that are offset in height have a pure phase modulation effect. Height offsets (also referred to herein as mirror displacements) are typically established in terms of a fraction of wavelength of the incident beam of radiation (e.g., h=¼$\lambda$). However, in some embodiments, small (e.g., h<⅛$\lambda$) height offsets may be deliberately imposed to correct certain known SLM imperfections.

Depending on the particular height offset, adjacent flat micromirrors can achieve an intensity modulation anywhere between 100% positive phase intensity and 100% negative phase intensity. Mirror height and phase are related as follows:

$$\varphi = 2\frac{2\pi}{\lambda}\mathrm{height}$$

where $\phi$ is the phase, and $\lambda$ is the wavelength of the incident beam of radiation. The incident light is reflected by the mirror, and therefore the optical path deviation is twice the height. So, for example, a mirror displacement of ¼$\lambda$ is equivalent to a phase change of $\pi$. It should be noted that the height offsets (or mirror displacements) can be predetermined. That is, the height offsets can be manufactured into the array of individually controllable tilting mirrors, depending on the desired phase characteristics of the SLM array.

Figure 3A:
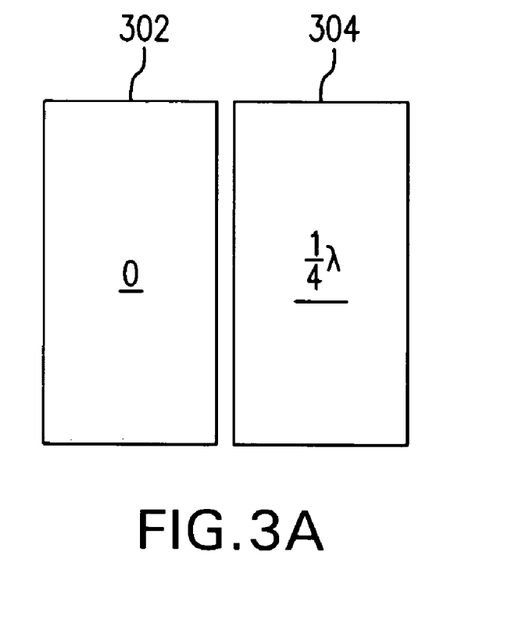
FIGS. 3A and 3B illustrate a superpixel comprising two rectangular tilting mirrors.
Figure 3B:
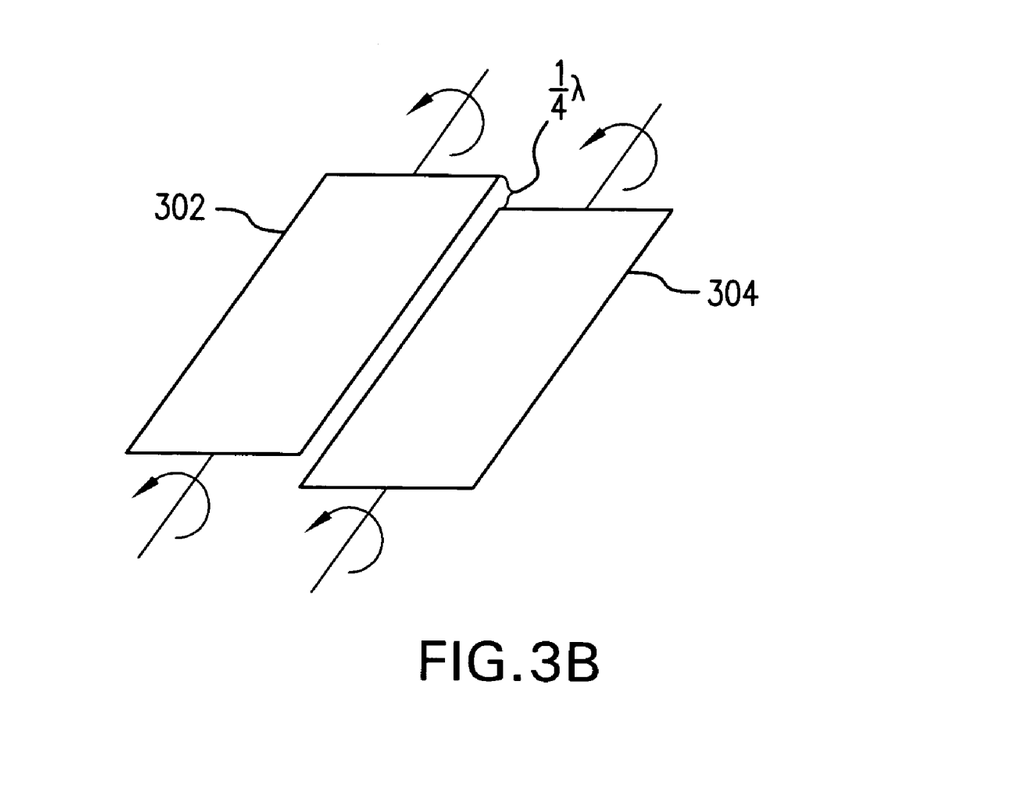

FIGS. 3A and 3B illustrate a simple superpixel of two logically coupled rectangular tilting mirrors that are offset in height from each other by a certain mirror displacement. Specifically, FIGS. 3A and 3B illustrate a superpixel where two rectangular tilting mirrors 302 and 304 are situated substantially adjacent to each other. Tilting mirrors 302 and 304 are logically coupled to each other. In other words, they are programmed and addressed to act as a unit within the SLM array, and to perform the function of a single pixel. Furthermore, tilting mirrors 302 and 304 are offset in height from each other by one quarter wavelength (¼$\lambda$) of the incident beam of radiation. It should be noted that the quarter wavelength offset is exemplary. Other exemplary offsets include ½$\lambda$, ⅛$\lambda$, or even smaller offsets.

Figure 4A:
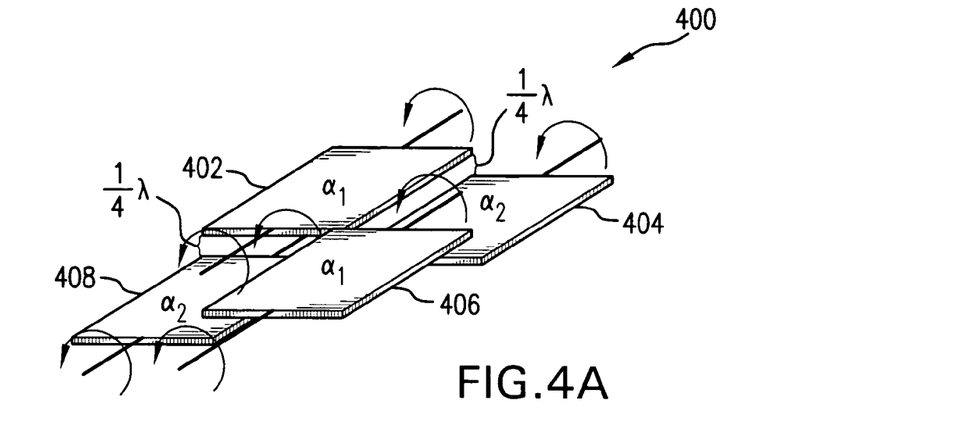
FIGS. 4A and 4B illustrate a superpixel comprising four square tilting mirrors, and having balanced tilting angles and mirror displacements.
Figure 4B:
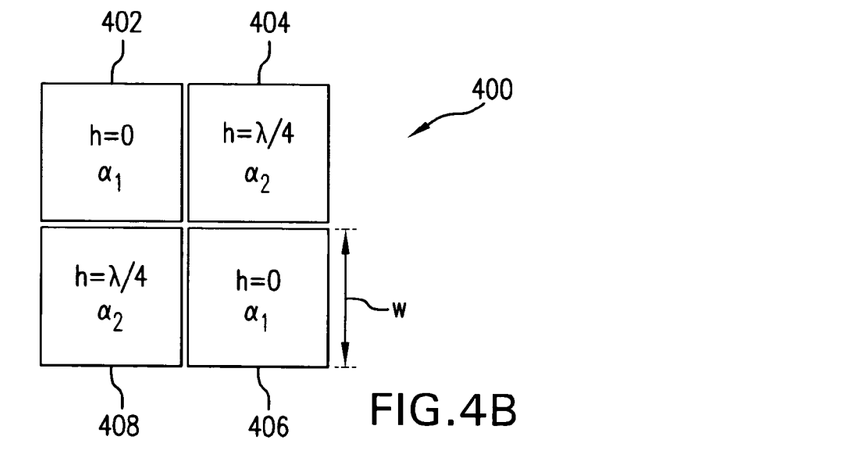

FIGS. 4A and 4B illustrate a superpixel 400 comprising four tilting mirrors with balanced mirror displacements and tilt angles. Superpixel 400 has four logically coupled tilting mirrors 402, 404, 406 and 408. The mirrors 402-408 are respectively arranged clockwise in a substantially square pattern. Additionally, the tilting mirrors are offset in height from a reference plane (not shown) wherein a height offset (or mirror displacement) of zero means that the mirror is even with the reference plane. Specifically, mirrors 402 and 406 have a mirror displacement of zero, and are logically coupled such that their tilt angles ($\alpha_1$) remain equal. Mirrors 404 and 408 have a mirror displacement of ¼$\lambda$, and are logically coupled such their tilt angles ($\alpha_2$) remain equal. All four tilting mirrors 401-408 are logically coupled to each other such that they function as a single pixel within the SLM array. Such a superpixel is referred to herein as having "balanced" mirror displacements and tilt angles, wherein mirrors diagonally positioned from each other have substantially similar height and tilt characteristics. The average amplitude reflectivity response for the real checkerboard superpixel 400 is as follows:

$$\tilde{A}_{superpixel} = 2w^2\left(\mathrm{sinc}\left(\frac{\alpha_1}{\alpha_o}\right) - \mathrm{sinc}\left(\frac{\alpha_2}{\alpha_o}\right)\right)$$

where w is the width of a single tilting mirror (e.g., tilting mirror 206), and $\alpha_o$ is the zero crossing tilt angle.

Equal maximum positive and negative amplitudes can hence be achieved. Therefore, the real checkerboard superpixel can be used to mimic AltPSM masks. Comparing the real checkerboard superpixel to an equivalent single flat-tilting mirror (e.g., tilting mirror 205), there is a positive intensity reduction from 100% to about 37%, but a gain in negative intensity from 4.7% to about negative 37%. This means that AltPSM emulation with a single mirror requires "throwing out" over 95% of the light that can be potentially reflected by the mirror, whereas superpixel 400 only throws out 67% of the light. Thus, AltPSMs can be achieved using a superpixel comprised of flat tilting mirrors.

Figure 4C:
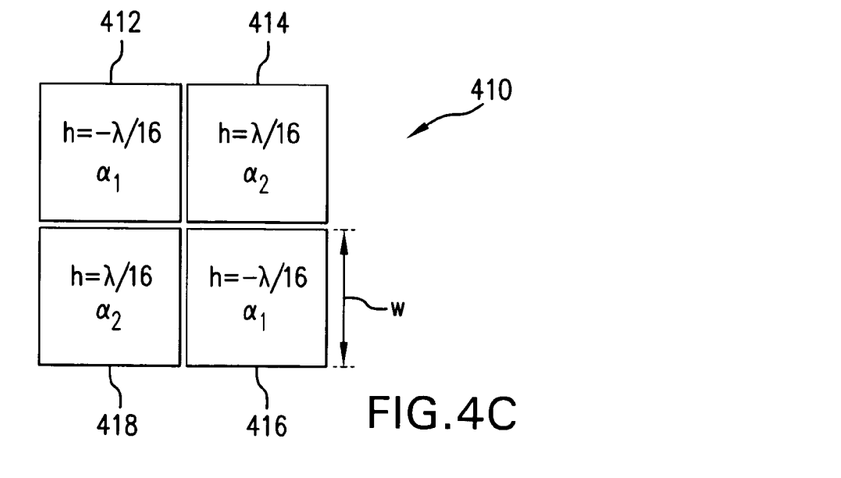
FIG. 4C illustrates a complex checkerboard superpixel.

A complex checkerboard superpixel 410 is shown in FIG. 4C. As with the superpixel shown in FIGS. 4A and 4B, the mirror displacements and tilt angles of superpixel 410 are balanced. Superpixel 410 also has four logically coupled tilting mirrors 412, 414, 416 and 418. The mirrors 412-418 are respectively arranged clockwise in a substantially square pattern. Specifically, mirrors 412 and 416 have a mirror displacement of negative ¹⁄₁₆$\lambda$, and are logically coupled such that their tilt angles ($\alpha_1$) remain equal. Mirrors 414 and 418 have a mirror displacement of ¹⁄₁₆$\lambda$, and are logically coupled such their tilt angles ($\alpha_2$) remain equal. The average amplitude reflectivity response for the complex checkerboard superpixel shown FIG. 4C is as follows:

$$\tilde{A}_{superpixel} = 2w^2\left(e^{-i\frac{\pi}{4}}\mathrm{sinc}\left(\frac{\alpha_1}{\alpha_o}\right) + e^{i\frac{\pi}{4}}\mathrm{sinc}\left(\frac{\alpha_2}{\alpha_o}\right)\right)$$

where w is the width of a single tilting mirror (e.g., tilting mirror 416), and $\alpha_o$ is the zero crossing tilt angle. Grayscaling at constant phase (phase=0 in this case) can be accomplished if $\alpha_1=\alpha_2$ resulting in 50% intensity reduction relative to a single flat-tilting mirror intensity. Otherwise, the behavior is identical to superpixel 400.

Figure 5:
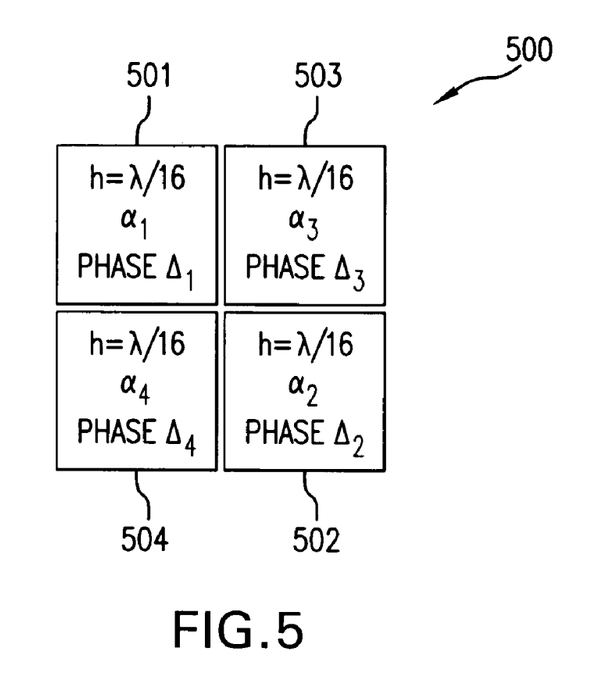
FIG. 5 illustrates a superpixel having randomly distributed phase errors.

In a more realistic situation, each individual tilting mirror within the superpixel will have, in addition to the designed phase offset, a phase error ($\Delta i$) that is probably randomly distributed over the array of individually controllable tilting mirror SLMs from which the superpixel is formed. Such a superpixel is illustrated in FIG. 5, which depicts a complex checkerboard superpixel with phase errors. Specifically, FIG. 5 shows a superpixel 500 with four tilting mirrors where the mirror displacements are balanced. Phase offsets are depicted respectively for mirrors 501, 502, 503, and 504 as $\Delta_1$-$\Delta_4$, while the tilt angles are depicted respectively as $\alpha_1$-$\alpha_4$. The average amplitude reflectivity response of the complex checkerboard superpixel of FIG. 5 is as follows:

$$\tilde{A}_{superpixel} = w^2 \left( \frac{e^{i\Delta_1} e^{-i\frac{\pi}{4}} \mathrm{sinc}\left(\frac{\alpha_1}{\alpha_o}\right) + e^{i\Delta_3} e^{i\frac{\pi}{4}} \mathrm{sinc}\left(\frac{\alpha_3}{\alpha_o}\right) +}{\underbrace{\phantom{XXXXXXXXXXXXXXXXXXXXXX}}_{\tilde{A}_{13}}} \frac{e^{i\Delta_2} e^{-i\frac{\pi}{4}} \mathrm{sinc}\left(\frac{\alpha_2}{\alpha_o}\right) + e^{i\Delta_4} e^{i\frac{\pi}{4}} \mathrm{sinc}\left(\frac{\alpha_4}{\alpha_o}\right)}{\underbrace{\phantom{XXXXXXXXXXXXXXXXXXXXXX}}_{\tilde{A}_{24}}} \right)$$

grouping the mirrors into pairs (501,503) and (502, 504) and calculating the compensated amplitude for each pair, with $\alpha_1=\alpha_2$, yields:

for $\alpha_1 = \alpha_2$ $$\tilde{A}_{superpixel} = \sqrt{2}\, w^2 \mathrm{sinc}\left(\frac{\alpha_1}{\alpha_o}\right)$$

$$\left( \frac{\cos(\Delta_3)\cos(\Delta_1) + \sin(\Delta_3)\sin(\Delta_1)}{\cos(\Delta_3) + \sin(\Delta_3)} + \frac{\cos(\Delta_4)\cos(\Delta_2) + \sin(\Delta_4)\sin(\Delta_2)}{\cos(\Delta_4) + \sin(\Delta_4)} \right)$$

Correcting phase errors thus results in an attenuated reflected amplitude. This attenuation is a fraction of a percent, even for phase errors of about 5 degrees. For larger phase errors, this reduction in reflectivity will have to be taken into account during rasterization.

Figure 6:
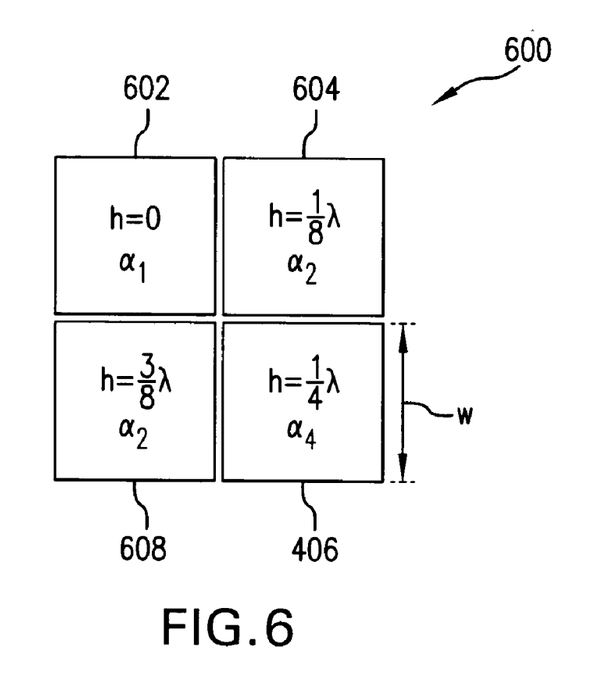
FIG. 6 illustrates a superpixel having unbalanced heights and tilt angles.

The embodiments described above have generally shown balanced height offsets (mirror displacements) and tilt angles. In alternative embodiments, unbalanced superpixels may be formed. FIG. 6 shows such an unbalanced superpixel 600. In the embodiment of FIG. 6, superpixel 600 is shown with four logically coupled tilting mirrors, respectively labeled 602, 604, 606 and 608. Tilting 602 mirror has a tilt angle $\alpha 1$ with a mirror displacement of zero, tilting mirror 604 has a tilt angle $\alpha 2$ with a mirror displacement of $\frac{1}{8}\lambda$, tilting mirror 606 has a tilt angle $\alpha 3$ with a mirror displacement of $\frac{1}{4}\lambda$, and tilting mirror 608 has a tilt angle $\alpha 4$ with a mirror displacement of $\frac{3}{8}\lambda$. In other words, in this embodiment, the mirror displacements form a helical shape. The average amplitude reflectivity response of such an unbalanced complex helical superpixel is as follows:

$$\tilde{A}_{superpixel} = w^2 \left[ \mathrm{sinc}\left(\frac{\alpha_1}{\alpha_o}\right) - \mathrm{sinc}\left(\frac{\alpha_4}{\alpha_o}\right) + e^{i\frac{\pi}{2}} \mathrm{sinc}\left(\frac{\alpha_2}{\alpha_o}\right) - e^{i\frac{\pi}{2}} \mathrm{sinc}\left(\frac{\alpha_3}{\alpha_o}\right) \right]$$

To generate pure phase object behavior, one needs to be able to vary the phase at a fixed amplitude. Also, it should be noted that the maximum amplitude is proportional to $w^2=W^2/$ 4, and therefore the maximum intensity is $\frac{1}{16}^{th}$ of the equivalent single-wide piston mirror. This means that, for this example, the ability to mimic arbitrary phase comes at the cost of losing about 94% in reflectivity.

The same complex helical superpixel can also be used as a grayscale device when tilt angles are set-up appropriately. When this is the case, it is possible to maintain the phase constant and vary the superpixel grayscale. The maximum positive and negative intensities in this case are about 18% of the maximum intensity reflected by the equivalent single-wide flat tilting mirror. This combination can emulate an AltPSM with about 82% loss compared to 95% for a single-wide flat-tilting mirror.

In yet an alternate embodiment, phase-step tilting mirrors may be used to form superpixels. Phase-step mirrors have the advantage of being able to generate negative 70% to positive 70% of the amplitude reflectivity of flat mirrors in both the plus and minus tilt directions, where the flat tile mirror has amplitude reflectivities ranging from negative 20% to positive 100%.

Figure 7A:
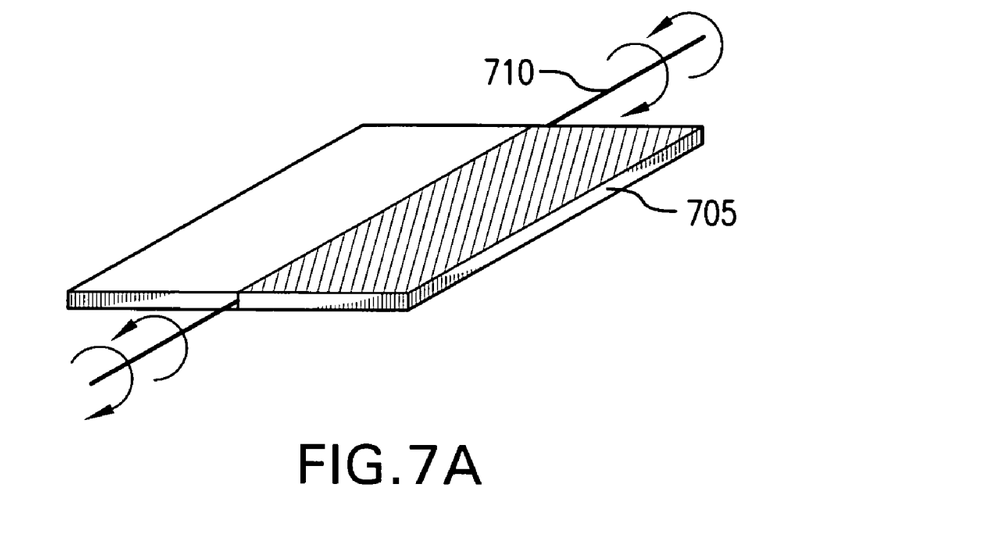
FIG. 7A illustrates a single phase-step tilting mirror.
Figure 7B:
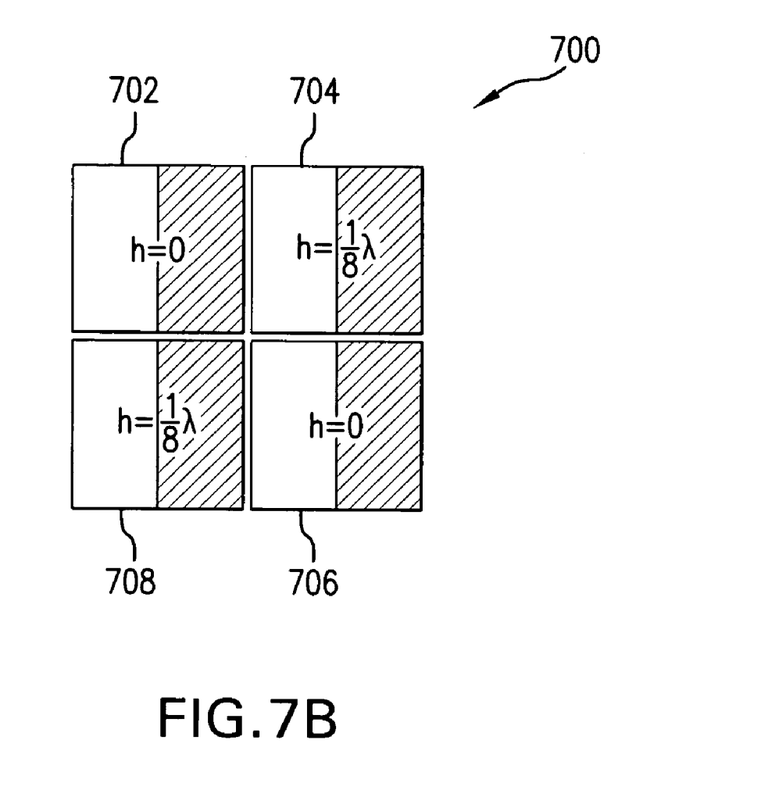
FIG. 7B illustrates a superpixel including four single phase-step tilting mirrors.

FIG. 7A illustrates a single phase-step tilting mirror. Such a mirror has been invented by Micronic Laser Systems, Box 3141, 183 03 Taby, Sweden. An exemplary single phase-step tilting mirror may have a $\lambda/4$ height step, and phase step of $\lambda/2$. As noted above, such a mirror can achieve an intensity modulation anywhere between 50% and negative 50%. FIG. 7B illustrates a superpixel 700 incorporating such phase-step mirrors.

As shown, superpixel 700 has balanced mirror displacements with mirrors 704 and 708 having a mirror displacement of $\frac{1}{8}\lambda$. Superpixel 700 is capable of emulating all mask types, including arbitrary phase mask types such as vortex masks with larger efficiency than the helical superpixel with flat tilting mirrors described above (i.e., superpixel 600). The intensity efficiency of superpixel 700 ranges from 12.5% for phases coinciding with the natural phase of any of the two sub-pixel pairs (e.g., mirrors 702, 704) to 25% for phases exactly between these phases. This may be contrasted with 100% intensity efficiency for a pure piston mirror. The intensity efficiency, however, is still higher than the 9% efficiency of balanced, flat mirror $\frac{1}{8}\lambda$ displacement superpixel.

In an alternative embodiment (not illustrated), small mirror displacements (e.g., $h<<\frac{1}{8}\lambda$) may be deliberately imposed in a balanced fashion between the phase-step tilt mirrors. Such a height offset scheme allows compensation with minimum light loss of the phase effects of small random height variations that occur during the fabrication of the individual tilting mirrors in the SLM array. The maximum efficiency of such a superpixel is still about 50%.

In conclusion, phase-step mirrors in superpixel configuration lead to higher intensity efficiencies when hard phase shifting is required, and the intensity is created more symmetrically dispersed over the superpixel than when using flat tilting mirrors. With phase-step mirrors, a helical configuration (e.g., superpixel 600) is no longer needed to address all phase angles. Rather, the balanced mirror configuration of superpixel 700 is sufficient by virtue of the symmetrical intensity created by phase-stepped mirrors in negative and positive phase sense.

As described above, the inventors have discovered that combining tilting mirrors, which are offset in height with respect to each other, into superpixels improves intensity modulation characteristics, and enhances the array's ability to mimic arbitrary grayscale and phase. In an embodiment, a SLM chip may have millions of tilting micromirrors in an addressable array. An SLM pattern generator would select the appropriate superpixel configuration depending on the desired reflectivity and phase characteristics, and depending on the location of the features to be imaged. It should be noted that, for simplicity, the above described embodiments have included either two- or four-mirror superpixel configurations. However, superpixels comprising any number of mirrors could be programmably selected in an SLM pattern generator, depending on the desired characteristics of the pixel.

Figure 8:
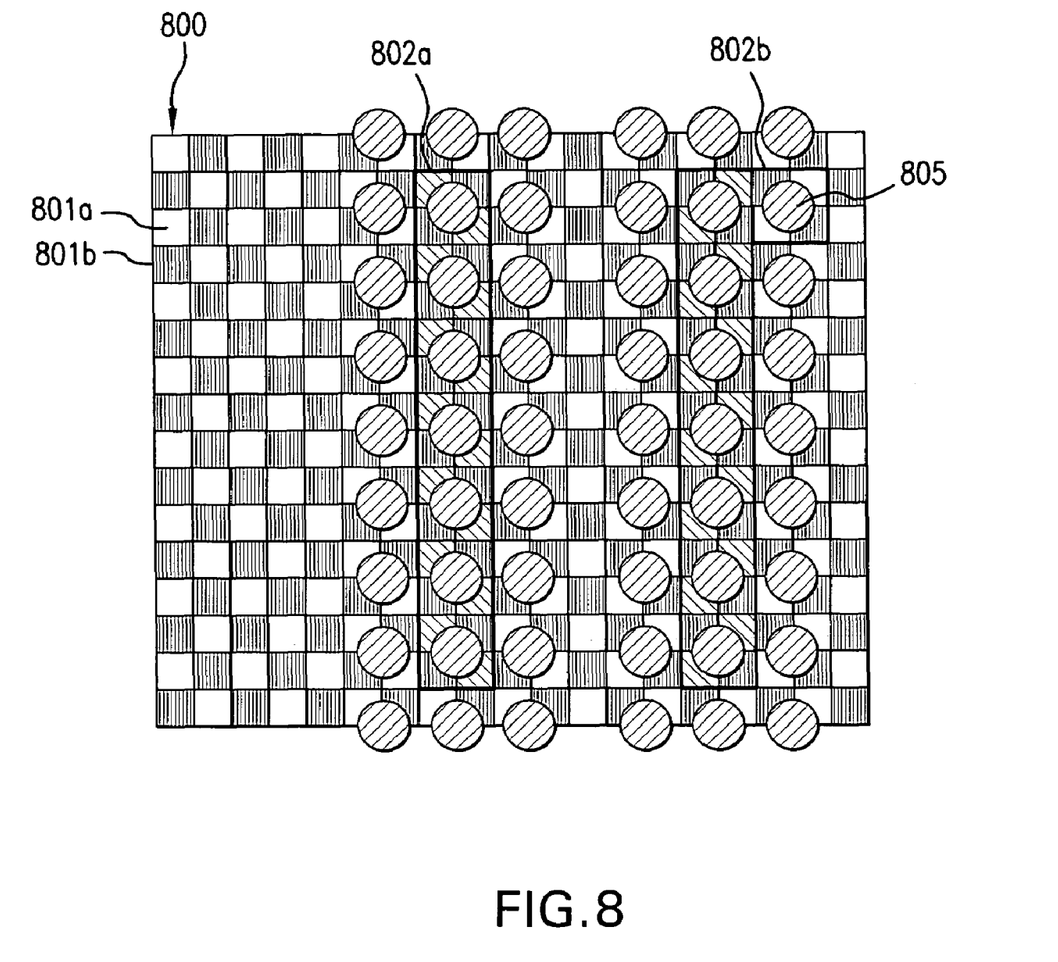
FIG. 8 illustrates how superpixels may be formed in an SLM depending on feature location.

FIG. 8 illustrates an exemplary portion of an SLM array 800 made up of individually controllable flat tilting mirrors (e.g., 801a and 801b). This exemplary portion of SLM array 800 has been fabricated such that the individual tilting mirrors are offset in height from each other. For example, tilting mirror 801a may have a mirror displacement of zero from a reference plane (not shown), while tilting mirror 801b may have a mirror displacement of $\lambda/4$ from the reference plane. The exemplary tilting mirrors are arranged in checkerboard pattern such that a balanced superpixel (e.g., superpixel 400) may be formed by selecting or addressing four adjacent mirrors. This is illustrated in FIG. 8 by a circle superimposed over the four mirrors making up a superpixel (e.g., superpixel 805). FIG. 8 further illustrates how the superpixels may be chosen depending on the location of the features to be imposed on a target. Such features are illustrated by patterns 802a and 802b.

Various embodiments of the present invention have been described above. It should be understood that these embodiments have been presented by way of example only, and not limitation. It will be understood by those skilled in the relevant art that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A light patterning system, comprising:
   an illumination system that supplies a beam of radiation having a certain wavelength ($\lambda$);
   an array of individually controllable elements that patterns said beam, wherein said array includes a superpixel having at least a first tilting mirror that is logically coupled to a second tilting mirror, and wherein said first and second tilting mirrors are (i) substantially adjacent to each other, and (ii) offset in height from each other by a mirror displacement, and
   a projection system that projects said patterned beam onto a target.

2. The system of claim 1, wherein said mirror displacement is some fraction of $\lambda$.

3. The system of claim 1, wherein said mirror displacement is selected from the group consisting of zero, $\lambda/4$, or $\lambda/8$.

4. The system of claim 1, wherein said first and second tilting mirrors respectively have programmable first and second tilt angles, thereby permitting a superpixel including said first and second tilting mirrors to reflect the beam of radiation with a selected grayscale and phase.

5. The system of claim 4 wherein when said first and second tilting mirrors are at rest, said first and second tilting mirrors are in a position of maximum reflectivity.

6. The system of claim 1, wherein each of said tilting mirrors is a flat-tilting mirror.

7. The system of claim 1, wherein each of said tilting mirrors is phase-stepped mirror.

8. The system of claim 7, wherein when said first and second tilting mirrors are at rest, said first and second tilting mirrors are in a position of minimum reflectivity.

9. The system of claim 1, wherein said first and second tilting mirrors forming said superpixel are selected from amongst a plurality of such tilting mirrors to form said pixel depending on the location of a feature to be patterned on said target.

10. A light patterning system, comprising:
    an illumination system that supplies a beam of radiation having a certain wavelength ($\lambda$);
    an array of reflective pixels that patterns said beam, wherein said array includes pixels having first through fourth tilting mirrors that are logically coupled to each other, and wherein said first through fourth tilting mirrors are respectively (i) arranged in a substantially square pattern, and (ii) offset in height from a reference plane by first through fourth mirror displacements; and
    a projection system that projects said patterned beam onto a target.

11. The system of claim 10, wherein said mirror displacements are balanced such that said first mirror displacement is substantially equal to said third mirror displacement, and said second mirror displacement is substantially equal to said fourth mirror displacement.

12. The system of claim 11, wherein said first and third mirror displacements are zero, while said second and fourth mirror displacements are $\lambda/4$.

13. The system of claim 11, wherein said first and third mirror displacements are zero, while said second and fourth mirror displacements are $\lambda/8$.

14. The system of claim 12, wherein said first through fourth mirror displacements are zero.

15. The system of claim 10, wherein said first through fourth mirror displacements are different from each other.

16. The system of claim 15, wherein said first through fourth mirror displacements are less than $\frac{1}{8}\lambda$.

17. The system of claim 15, wherein said first mirror displacement is zero, said second mirror displacement is $\lambda/8$, said third mirror displacement is $\lambda/4$, and said fourth mirror displacement is $3\lambda/8$.

18. The system of claim 10, wherein said first through fourth tilting mirrors respectively have programmable first through fourth tilt angles, thereby permitting a superpixel including said first through fourth tilting mirrors to reflect the beam of radiation with selected grayscale and phase.

19. The system of claim 18, wherein said tilt angles are balanced such that said first tilt angle is substantially equal to said third tilt angle, while said second tilt angle is substantially equal to said fourth tilt angle.

20. The system of claim 18, wherein said first through fourth tilt angles are different from each other.

21. The system of claim 18, wherein when said first through fourth tilting mirrors are at rest, said first through fourth tilting mirrors are in a position of maximum reflectivity.

22. The system of claim 10, wherein each of said tilting mirrors is a flat-tilting mirror.

23. The system of claim 10, wherein each of said tilting mirrors is phase-stepped mirror.

24. The system of claim 23, wherein when said first through fourth tilting mirrors are at rest, said first through fourth tilting mirrors are in a position of minimum reflectivity.

25. The system of claim 10, wherein said first through fourth tilting mirrors are selected from amongst a plurality of such tilting mirrors to form said superpixel depending on the location of a feature to patterned on said target.

26. A method for patterning a beam of radiation, comprising:

patterning a beam of radiation having a wavelength ($\lambda$) using an array of reflective pixels, wherein said array includes superpixels having at least a first tilting mirror that that is logically coupled to a second tilting mirror, and wherein said first and second tilting mirrors are (i) offset in height from each other by a mirror displacement, and (ii) substantially adjacent to each other; and projecting the patterned beam onto a target portion of an object.

27. The method of claim 26, wherein said first and second mirror respectively have a first and second tilt angle, the method further comprising programmably selecting said first and second tilt angles so that said pixel reflects the beam of radiation with a selected grayscale and phase.

28. The method of claim 26, further comprising emulating at least one of a binary mask, attenuating phase shift mask, and alternating phase shift mask using said superpixels.

29. The method of claim 26, further comprising selecting said first and second tilting mirrors from amongst a plurality of such tilting mirrors, depending on the location of a feature to patterned on said target.

* * * * *